United States Patent [19]

Shirai

[11] Patent Number: 5,059,547
[45] Date of Patent: Oct. 22, 1991

[54] METHOD OF MANUFACTURING DOUBLE DIFFUSED MOSFET WITH POTENTIAL BIASES

[75] Inventor: Koji Shirai, Kawasaki, Japan

[73] Assignee: Kabushiki Kaisha Toshiba, Kawasaki, Japan

[21] Appl. No.: 412,149

[22] Filed: Sep. 25, 1989

Related U.S. Application Data

[62] Division of Ser. No. 132,032, Dec. 14, 1987, Pat. No. 4,884,116.

[30] Foreign Application Priority Data

Dec. 20, 1986 [JP] Japan ................................. 61-304671

[51] Int. Cl.$^5$ ........................................... H01L 21/336
[52] U.S. Cl. ........................................ 437/40; 437/21; 437/62; 437/152; 148/DIG. 12
[58] Field of Search ............... 148/DIG. 12; 437/152, 437/41, 40, 56, 57, 83, 93, 21, 62; 357/23.4, 23.8

[56] References Cited

U.S. PATENT DOCUMENTS

| | | | |
|---|---|---|---|
| 4,507,158 | 3/1985 | Kamins et al. | 437/67 |
| 4,523,213 | 6/1985 | Konaka et al. | 57/23.8 |
| 4,621,276 | 11/1986 | Malhi | 357/42 |
| 4,700,454 | 10/1987 | Baerg et al. | 437/41 |
| 4,753,896 | 6/1988 | Matloubian | 437/29 |
| 4,778,775 | 10/1988 | Tzeng | 437/57 |
| 4,786,952 | 11/1988 | MacIver et al. | 357/23.4 |
| 4,837,186 | 6/1989 | Ohata et al. | 148/DIG. 12 |
| 4,884,116 | 11/1989 | Shirai | 357/41 |

OTHER PUBLICATIONS

Kimura, M., et al., *Appl. Phys. Lett.*, 43(3), Aug. 1, 1983, pp. 263–265.
Brock, G. E., et al., *IBM Technical Disclosure Bulletin*, vol. 19, No. 9, Feb. 1977, pp. 3405–3406.

*Primary Examiner*—Brian E. Hearn
*Assistant Examiner*—T. N. Quach
*Attorney, Agent, or Firm*—Finnegan, Henderson, Farabow, Garrett and Dunner

[57] ABSTRACT

First and second single crystal silicon substrates are integrated, by means of a thermal treatment, with first and second silicon oxide films formed on surfaces of said respective first and second single crystal silicon substrates in contact with each other. More specifically, an insulating region is formed by integrating first and second silicon oxide films formed on the first and second single crystal silicon substrates. First and second semiconductor regions constituted by the first and second single crystal silicon substrates are electrically isolated by the insulating region. As a result, it is possible to reduce the width of the depletion layer generated in the second semiconductor region by the influence of the first semiconductor region in which an element is formed. A back gate region formed in the second semiconductor region and the first semiconductor region, in which an element is not formed, are held substantially at an equal potential. In this way, it is possible to improve the yield voltage characteristics between the first semiconductor region, which does not form any element, and the back gate region. The insulating region which electrically isolates the first and second semiconductor regions from each other, is formed by bonding together first and second silicon oxide films on surfaces of the first and second single crystal silicon substrates. Therefore, the process of manufacture is simplified.

3 Claims, 3 Drawing Sheets

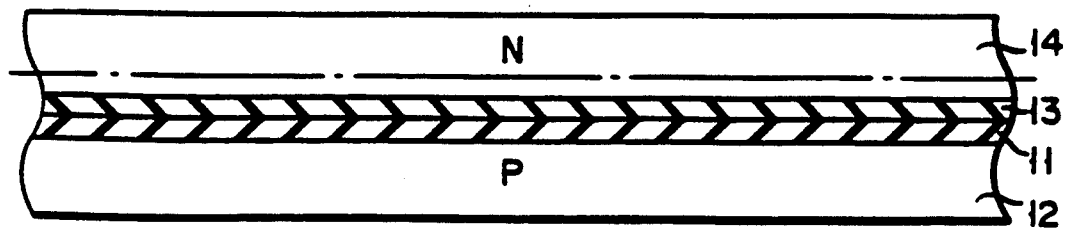
F I G. 4A
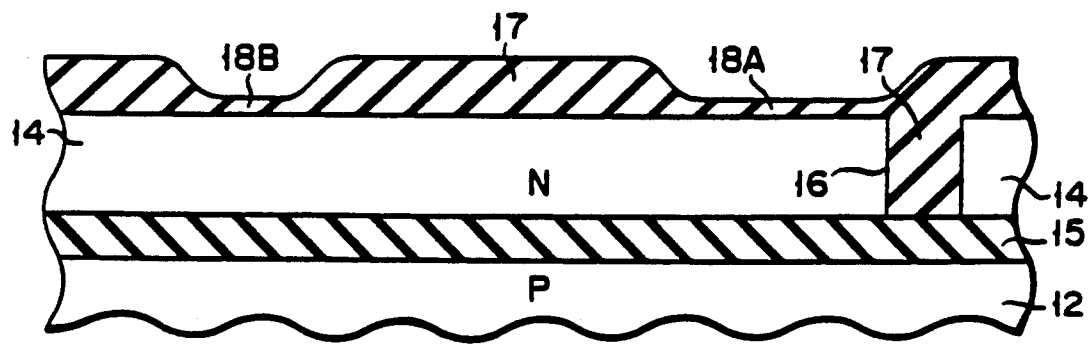
F I G. 4B
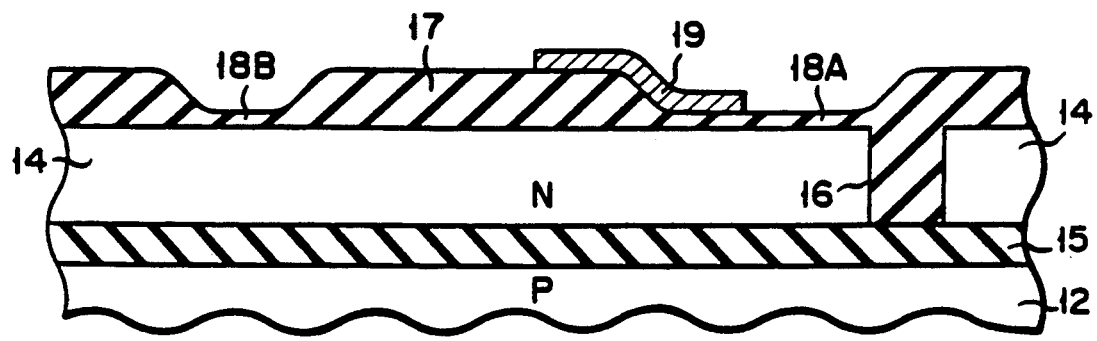
F I G. 4C

METHOD OF MANUFACTURING DOUBLE DIFFUSED MOSFET WITH POTENTIAL BIASES

This is a division of application Ser. No. 132,032, filed Dec. 14, 1987, now U.S. Pat. No. 4,884,116.

BACKGROUND OF THE INVENTION

This invention relates to a semiconductor device, in which the breakdown voltage is increased, and a method of manufacturing the same.

FIGS. 1 and 2 show examples of high breakdown voltage semiconductor devices, i.e. transistors having a breakdown voltage of 500 V or higher, which are well known in the art.

FIG. 1 shows a vertical npn bipolar transistor. In this Figure, reference numeral 41 designates an n+-type collector region, 42 an n-type high resistivity collector region, 43 a p-type base region, 44 an n+-type emitter region, 45 a base electrode, and 46 an emitter electrode. Such a transistor has a vertical structure, and it permits high breakdown characteristics to be obtained owing to p-type guard ring region 47 surrounding p-type base region 43.

However, the base-emitter breakdown voltage (BV$_{CEO}$) depends on the current amplification factor of the transistor and is unstable. Further, rupture of the element is liable to result from heat-based secondary yield phenomenon. Therefore, problems arise with reliability. Further, guard ring area 47 increases the element area.

FIG. 2 shows a double diffusion type MOS transistor (D-MOS). In this Figure, reference numeral 51 designates an n+-type drain region, 52 an n-type drain high resistivity region, 53 a p-type back gate region, 54 an n+-type source region, 55 a gate electrode, 56 a source electrode, and 57 a p-type guard ring region.

A MOS transistor as shown in FIG. 2 has a double diffusion structure, wherein it is possible to obtain high breakdown characteristics. However, because the MOS transistor as shown in FIG. 2 is a vertical element structure, the width 11 of n-type high resistivity drain region 52 is not made accurately. Therefore, if fluctuations are produced in the "on" resistance of MOS transistor, the "on" resistance is increased due to the influence of a parasitic junction field-effect transistor (i.e., junction FET) produced in n⁻-type high resistivity drain region 52 between opposed p-type back gate regions 53. Therefore, there are problems in characteristics other than the breakdown characteristics. Even with such a MOS transistor, guard ring region 57 is necessary, so that the area of the element is increased.

FIG. 3 shows a vertical MOS transistor having open-drain structure. In this Figure, reference numeral 61 designates a p-type substrate, 62 an n-type high resistivity drain region, 63 a p-type back gate region, 64 an n-type source region, 65 an n+-type drain region, 66 a gate electrode, 67 a source electrode, and 68 a drain electrode.

MOS transistor as shown in FIG. 3 also has high breakdown characteristics because of the structure noted above. However, because a depletion layer occurs from p-type substrate 61 into n⁻-type high resistivity drain region 62, it is necessary to form the width 12 of high resistivity drain region 62 sufficiently wide. High resistivity drain region 62 is formed by means of the epitaxial growth process. Therefore, in order to sufficiently increase the width of region 62, a long time is required for the epitaxial growth. Further, in this transistor source electrode 67 is connected to p-type substrate 61 via p-type back gate region 63, and source electrode 67 is held at the substrate potential. Therefore, with this transistor the output signal can be taken out only from drain electrode 68, and the use is limited.

SUMMARY OF THE INVENTION

An object of the invention is to provide a semiconductor device, and a manufacturing method which permits breakdown voltage increase without spoiling a reliability and breakdown voltage characteristic, making manufacturing process simple.

The semiconductor device according to the invention comprises a first semiconductor region, an insulating region formed over the entire surface of the first semiconductor region a second semiconductor region, formed over the entire surface of the insulating region, and a third semiconductor region, which contains impurities of the opposite conductivity type to that of the second semiconductor region and is held at a potential substantially equal to that of the first semiconductor region.

In the process of manufacturing the semiconductor device according to the invention, a first substrate, in which the first semiconductor region is covered by the insulating region, and a second substrate, in which the second semiconductor region is covered by an insulating region, are bonded together, by means of heat treatment, with their insulating regions in contact with each other, and then the first semiconductor region is removed such that a portion of a residual portion of the first semiconductor region has a predetermined thickness.

The semiconductor device according to the invention adopts a structure in which the first and second regions are separated by an insulating region. The width of the depletion layer which occurs in the second semiconductor region is reduced in comparison with a conventional semiconductor device, to reduce the thickness of the second semiconductor region. The third semiconductor region is held at a potential substantially equal to the first semiconductor region. As a result, the difference in potential between the third and first semiconductor regions is reduced, thereby improving the yield voltage characteristics between the two layers.

In addition, the structure consisting of the first semiconductor region, the insulating region, and the second semiconductor region is formed by bonding together the first and second substrates. Therefore, a simplicity of manufacturing is obtained.

BRIEF DESCRIPTION OF THE DRAWINGS

FIG. 4A to FIG. 4E are drawings showing how to manufacture, by a method of the present invention, a vertical double diffusion type N-channel MOS transistor, in which:

FIG. 4A is a sectional view showing a pair of single crystal silicon substrates which are integrally formed in such a manner that silicon oxide films, formed on the surface of p-type and n-type single crystal silicon substrates, adhere to each other;

FIG. 4B is a sectional view showing that a thin n-type single crystal silicon substrate, a groove formed in the n-type single crystal silicon substrate, a silicon oxide film formed on the entire surface of the substrate, an element separation region formed in the groove and on the silicon oxide film the silicon oxide film to be subjected to selective etching, and a gate oxide film formed on the portion of the n-type substrate on which a source region and a drain region are to be formed;

FIG. 4C is a sectional view showing a gate electrode, one part of which overlaps one of gate oxide films where a source region is to be formed;

FIG. 4D is a sectional view showing a p-type back gate region formed on the n-type silicon substrate, situated in the lower portion of the gate electrode, such that it extends from the surface of the silicon substrate to the end portion thereof, and the source region which is a high concentration of the p-type region;

FIG. 4E is a sectional view showing that the silicon oxide film is formed over the entire surface, contact holes are formed, and a source electrode and a drain electrode are formed.

DETAILED DESCRIPTION OF THE PREFERRED EMBODIMENTS

Figure 1:
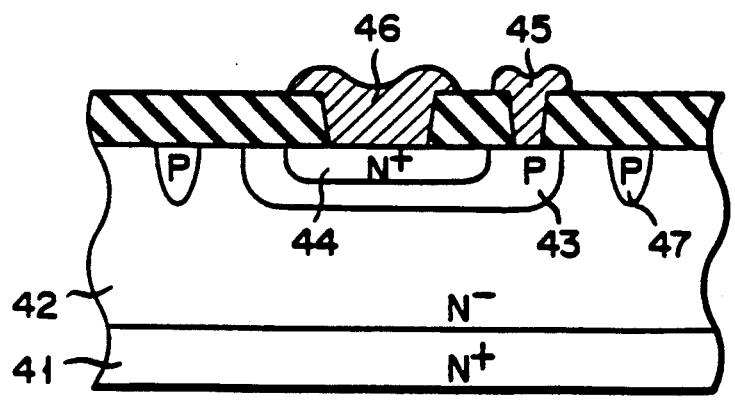
FIG. 1 is a sectional view of a vertical npn bipolar transistor.
Figure 2:
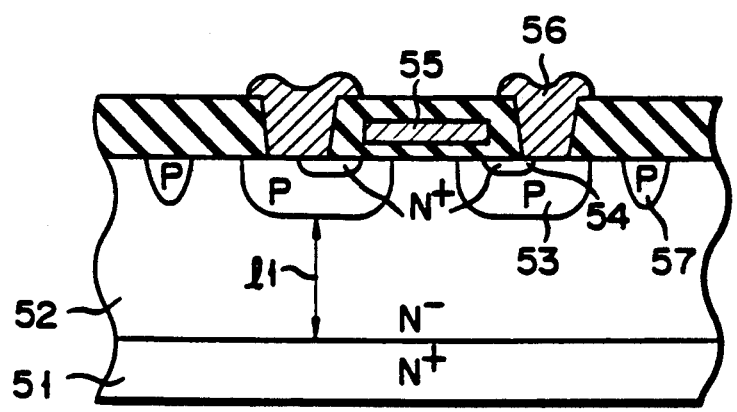
FIG. 2 is a sectional view of a double diffusion type MOS transistor.

FIGS. 4A to 4E are sectional views showing the process of manufacturing an n-channel MOS transistor of horizontal double diffusion type according to the present invention. This manufacturing process will now be described in detail.

First, silicon oxide film 11 having a thickness of 1.5 $\mu$m, is formed by a thermal oxidation process or a chemical vapor deposition process (CVD process) on one surface of p-type single crystal silicon substrate 12 of 600 $\mu$m thickness. Then, silicon oxide film 13 having a thickness of 1.5 $\mu$m is formed by a thermal oxidation process or a chemical vapor deposition process on one surface of n-type single crystal silicon substrate 14 of 600 $\mu$m thickness. Thereafter, silicon substrates 12 and 14 are bonded together by means of heat treatment, with silicon oxide films 11 and 13 held in contact with each other. The heat treatment for bonding substrates 12 and 14 is conducted for 30 minutes in an $H_2O$ atmosphere at 1,000° C.

After the bonding of silicon substrates 12 and 14, n-type single crystal silicon substrate 14 is reduced, to the extent shown by dashed lines in the FIG. 4A by a combination of a lapping technique, which is a mechanical surface polishing technique, and one of chemical a or physical etching technique. The eventual thickness of silicon substrate 14 is approximately 5 $\mu$m (FIG. 4A).

Next, groove 16 which reaches to insulating region 15 consisting of silicon oxide films 11 and 13 is formed in n-type single crystal silicon substrate 14, by means of RIE (reactive ion etching). Thereafter, a silicon oxide layer having a thickness of approximately 1 $\mu$m is formed on the surface of substrate 14, inclusive of the surfaces of groove 16, using the thermal oxidation process. Then, a silicon oxide layer having a thickness of the order of approximately 2 $\mu$m is formed by the CVD process on the entire surface. Isolating region 17 consists of a silicon oxide layer having a thickness of between 1 and 2 $\mu$m. Groove 16 is filled with silicon oxide layer constituting isolating region 17. Groove 16 and the silicon oxide layer filling groove 16 constitute an element separation region. Isolating region 17 defines an island region in substrate 14. Then, isolating region 17 is selectively removed by means of a photoetching process. Therefore, gate oxide films 18A and 18B are newly formed on the exposed surface of substrate 14 by the thermal oxidation process (FIG. 4B).

Subsequently, a polycrystalline silicon layer is deposited to a thickness of approximately 4,000 Å on the entire surface by the CVD process. As is shown in FIG. 4C, gate electrode 19 having a shape covering part of gate oxide film 18A is formed. When gate electrode 19 is being formed, an impurity for reducing the resistance of the polycrystalline silicon layer may be introduced simultaneously with the deposition of the layer. Alternatively, the impurity may be introduced after the deposition of the polycrystalline silicon layer (FIG. 4C). After forming a mask (not shown) covering gate oxide film 18B, boron (B) is ion implanted into gate oxide film 18A, with isolating region 17 and gate electrode 19 serving as a mask. After the ion implantation, heat diffusion is performed, and p-type back gate region 20 is formed in substrate 14. Diffusion treatment is performed such that the bottom of region 20 reaches insulating region 15 and the side portion of region 20 reaches 16 groove. Then, the mask on gate oxide film 18B is removed, and gate oxide films 18A and 18B are partly removed to expose part of the surface of substrate 14. After arsenic (As) has been ion implanted into the exposed part of substrate 14, an annealing treatment is performed, and n+-type source and drain regions 21 and 22 are formed in p-type back gate regions 20 and n+-type substrate 14 respectively.

Figure 4D:
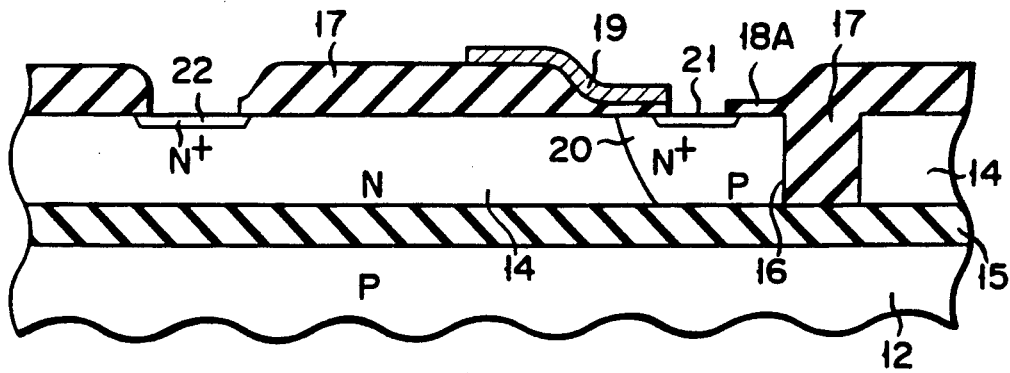
Figure 4E:
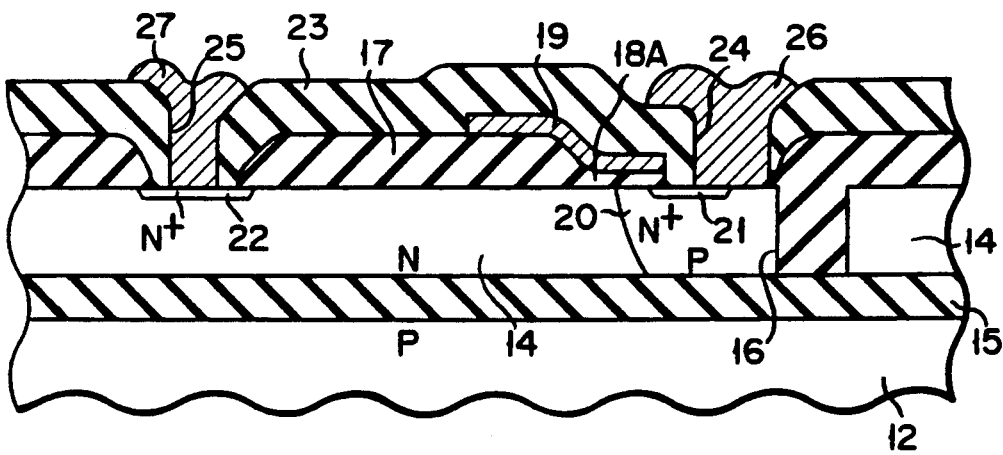

Next, silicon oxide film 23 having a thickness of 2 $\mu$m is deposited over the entire surface by the CVD process. After deposition of film 23 is completed, a gettering treatment is performed, which also serves as annealing. Contact holes 24 and 25 are then formed in silicon oxide film 23. Aluminum as a lead metal is deposited on the entire surface to a thickness of 2 $\mu$m, and is then patterned to form source and drain electrodes 26 and 27. Further, source and drain electrodes 26 and 27 are then sintered, and a surface protective film such as PSG (not shown) is deposited (FIG. 4E).

The MOS transistor which is manufactured in this way, has a double diffusion structure, in which island-like n-type substrate 14 serves as a high-resistivity drain region, p-type back gate region 20 with source region 21 serves as a channel region, and gate electrode 19 is located on the channel region via gate oxide film 18A which serves as gate insulating film. When this MOS transistor is used, p-type substrate 12 and p-type back gate region 20 are biased at a substantially equal potential.

The MOS transistor of this embodiment is a horizontal type, and the transversal distance of the high resistivity drain region (n-type substrate 14) between source and drain regions 21 and 22 is accurately determined by the size accuracy of the patterning techniques. The fluctuations of the "on" resistance and breakdown voltage, which depend on the lateral distance of the high resistivity drain region, decrease.

Figure 3:
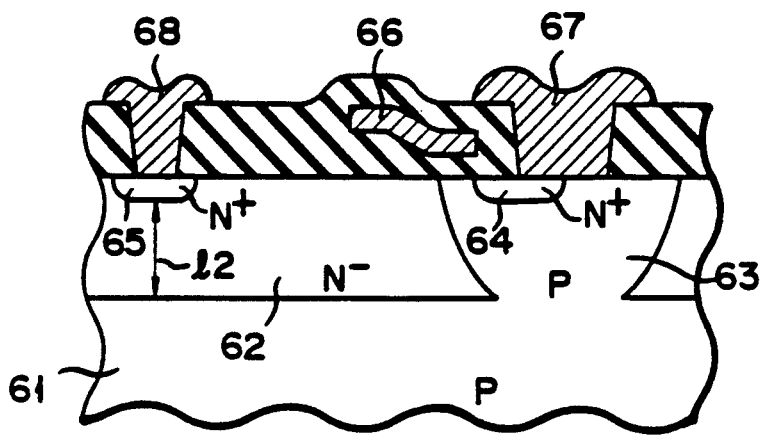
FIG. 3 is a sectional view of a vertical MOS transistor having an open-drain structure.

Further, in the p-type semiconductor region, to which n-type substrate 14 is contiguous, only back gate region 20 is formed, and the area of the p-n junction between the source and drain regions is greatly reduced as compared to the prior art device shown in FIG. 3. Thus, the parasitic capacitance between the source and drain regions is greatly reduced, and high speed operation of the MOS transistor is expected.

N-type substrate 14 is contiguous to p-type substrate 12 via insulating region 15. P-type substrate 12 is biased to a potential substantially equal to that of p-type back gate region 20. Therefore, depletion layer 31 extends on the side of n-type substrate 14 as shown in the sectional view of FIG. 5. Depletion layer 31 is contiguous to depletion layer 32 which is generated by p-type back gate region 20, so that concentration of the electric field due to the radius of curvature of region 20 is eliminated, and the yield voltage of p-type back gate region 20 is improved. For this reason, unlike in the case of the prior art device shown in FIG. 3, it is possible to increase the breakdown voltage of the semiconductor device without any measure, i.e. a guard ring, and thus reduce the area of the element. Further, p-type substrate 12 and p-type back gate region 20 are biased substantially to an equal potential. As a result, the difference in potential between substrate 12 and region 20 is reduced, whereby the breakdown voltage between p-type substrate 12 and p-type back gate region 20 is increased.

Figure 5:
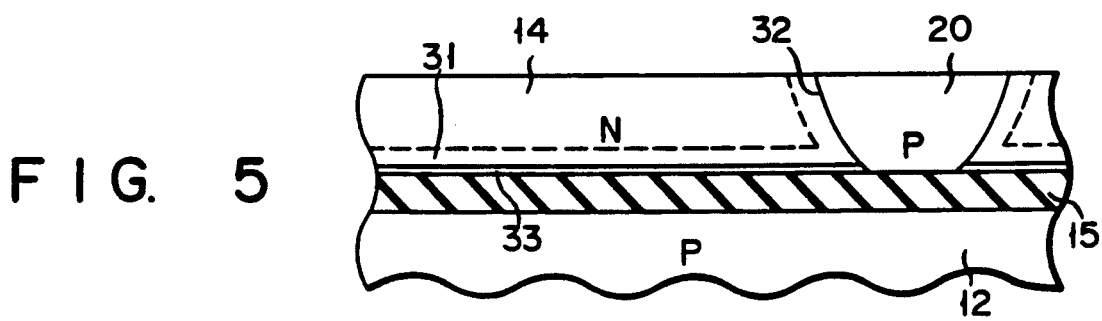
FIG. 5 is a sectional view explaining the state of generating a depression layer in the n-channel MOS transistor shown in FIG. 4E.

In addition, n-type substrate 14, insulating region 15 and p-type substrate 12 constitute a MOS structure. Therefore, compared to the case when the n-type semiconductor region (high resistivity drain region 62) and p-type region semiconductor region (p-type 61) are in direct contact with each other, as shown in FIG. 3, the width of the depletion layer extending from p-type substrate 12 to the n-type substrate 14 can be sufficiently reduced. As a result, it is possible to reduce the thickness of n-type substrate 14 sufficiently, reduce the diffusion time when forming p-type back gate region 20 and hence reduce thermal damage. Further, since the diffusion time can be reduced, the throughput (i.e., capacity of processing per unit time) is improved to reduce the cost of manufacture. Region 33 in FIG. 5 is an inversion layer due to p-type substrate 12.

Further, with the semiconductor device according to the invention it is possible to freely set the potential on source electrode 26. Thus, it is possible to take out output signals from source and drain electrodes 26 and 27, and the scope of application can be increased compared to the prior art device shown in FIG. 3.

Further, with the semiconductor device according to the invention a lamination structure consisting of p-type substrate 12, insulating region 15 and n-type substrate 14 is formed by the wafer bonding techniques. If an epitaxial growth process is used to form single crystal silicon regions on insulating regions as in the prior art, only polycrystalline silicon is grown on the insulating region, and it becomes necessary to perform such additional steps as laser annealing which is required for obtaining single crystal. In accordance with the invention, the single crystal silicon region can be easily formed by the wafer bonding techniques.

What is claimed is:

1. A method of manufacturing a vertical double diffusion MOS transistor, comprising the steps of:

contacting first and second insulating layers formed on the opposing surface of first and second semiconductor substrates and having first and second conductivity types;

converting said first and second insulating layers to a third insulating layer by thermal treatment, said third insulating layer being a unitary body of said first and second insulating layers;

forming a groove in said first semiconductor substrate, said groove reaching to said third insulating layer;

forming a fourth insulating layer covering the entire surface of said first semiconductor substrate and filling said groove;

forming first and second insulating films by selectively removing said forth insulating layer, said first and second insulating films serving as a gate insulating film of the MOS transistor;

forming a conductive layer of the second conductivity type on a portion of said first insulating film and on a portion of said fourth insulating layer, said conductive layer serving as a gate electrode of the MOS transistor;

forming a first conductive region of the second conductivity type by means of ion implantation and thermal diffusion, said first conductive region serving as a channel region of the MOS transistor, located underneath said first insulating film, and extending from the surface of said first semiconductor substrate to said third insulating layer and said groove; and forming first and second high impurity regions of the first conductivity type underneath said first and second insulating films, said first and second high impurity regions serving as a source and a drain of the MOS transistor.

2. A method according to claim 1, wherein the step of converting said first and second insulating layers to said third insulating layer is a step of performing a thermal treatment at 1,000° C. for 30 minutes.

3. A method according to claim 1, wherein the step of forming said fourth insulating layer is a step of forming a silicon oxide film by oxidizing the surface of said first semiconductor substrate by means of a thermal oxidation process and forming an additional silicon oxide film by means of a CVD process.

* * * * *

UNITED STATES PATENT AND TRADEMARK OFFICE
CERTIFICATE OF CORRECTION

PATENT NO. : 5,059,547

DATED : October 22, 1991

INVENTOR(S) : Koji Shirai

It is certified that error appears in the above-identified patent and that said Letters Patent is hereby corrected as shown below:

Claim 1, column 6, line 22, change "forth" to --fourth--.

Signed and Sealed this

Fourteenth Day of September, 1993

Attest:

BRUCE LEHMAN

*Attesting Officer*  *Commissioner of Patents and Trademarks*